(12) United States Patent
Cheung

(10) Patent No.: US 7,470,120 B2
(45) Date of Patent: Dec. 30, 2008

(54) CONFIGURABLE DIE DETACHMENT APPARATUS

(75) Inventor: Yiu Ming Cheung, Hong Kong (CN)

(73) Assignee: ASM Assembly Automation, Ltd., Singapore (SG)

( * ) Notice: Subject to any disclaimer, the term of this patent is extended or adjusted under 35 U.S.C. 154(b) by 386 days.

(21) Appl. No.: 11/292,901

(22) Filed: Dec. 1, 2005

(65) Prior Publication Data

US 2007/0128306 A1      Jun. 7, 2007

(51) Int. Cl.
*B29C 43/50*   (2006.01)
*B29C 45/40*   (2006.01)
*B29C 51/44*   (2006.01)

(52) U.S. Cl. .................. 425/190; 425/193; 425/544

(58) Field of Classification Search .............. 425/193, 425/DIG. 60, 444, 556, 577, 190
See application file for complete search history.

(56) References Cited

U.S. PATENT DOCUMENTS

| | | | | |
|---|---|---|---|---|
| 3,900,183 A | * | 8/1975 | Wallace | ........ 249/68 |
| 4,911,632 A | * | 3/1990 | Mansfield | ........ 425/183 |
| 5,755,373 A | | 5/1998 | Nakamura | ........ 228/6.2 |
| 6,047,623 A | * | 4/2000 | Whiteman et al. | ........ 83/618 |
| 6,201,306 B1 | | 3/2001 | Kurosawa et al. | ........ 257/783 |
| 2002/0019074 A1 | | 2/2002 | Nakazawa et al. | ........ 438/107 |
| 2002/0069952 A1 | | 6/2002 | Kurosawa | ........ 156/91 |

FOREIGN PATENT DOCUMENTS

| | | |
|---|---|---|
| EP | 1 429 372 A1 | 6/2004 |
| JP | 10-189690 | 7/1998 |

OTHER PUBLICATIONS

European Search Report. 5 pages.

* cited by examiner

*Primary Examiner*—Yogendra Gupta
*Assistant Examiner*—Emmanuel S Luk
(74) *Attorney, Agent, or Firm*—Ostrolenk, Faber, Gerb & Soffen, LLP

(57) ABSTRACT

A configurable die detachment apparatus is provided that can be used to handle a wide range of die sizes. The apparatus comprises a pin mounting assembly having a plurality of pin sites for selectively mounting ejector pins in a desired configuration on some of the pin sites and a vacuum enclosure enclosing the pin mounting assembly. The vacuum enclosure has a support platform comprising a plurality of openings that are sized and arranged to accommodate different configurations of ejector pins mounted on the pin mounting assembly, the ejector pins being drivable to project through the openings towards a die to be detached.

18 Claims, 11 Drawing Sheets

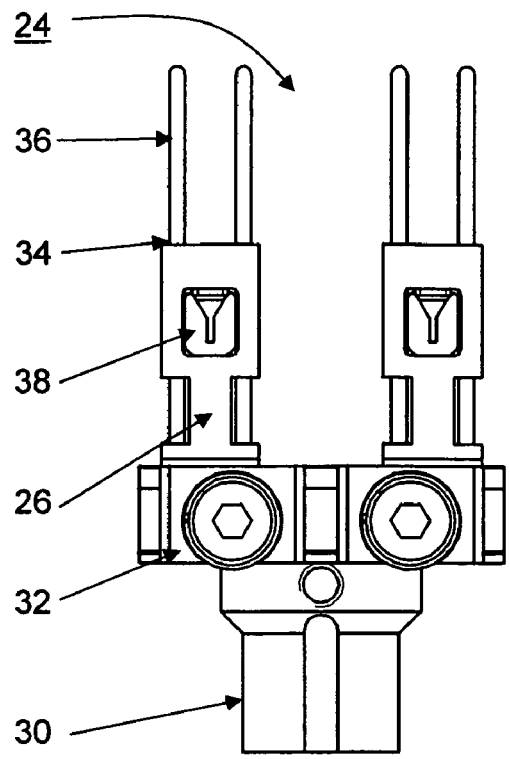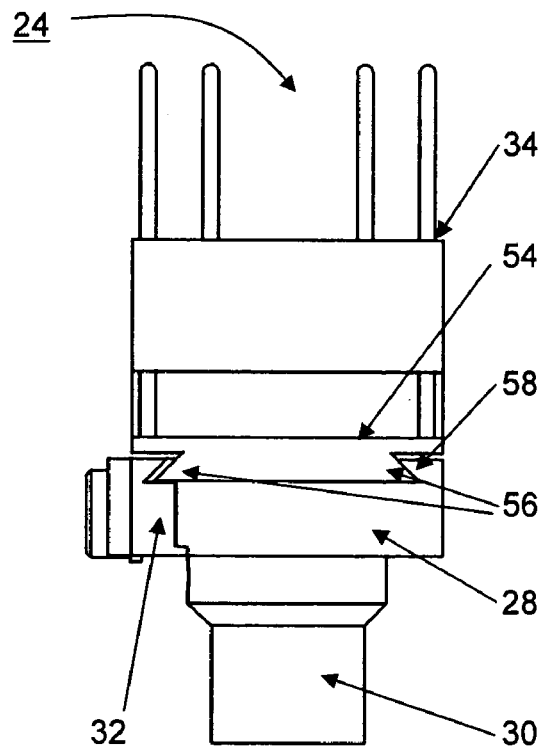
FIG. 7A  FIG. 7B
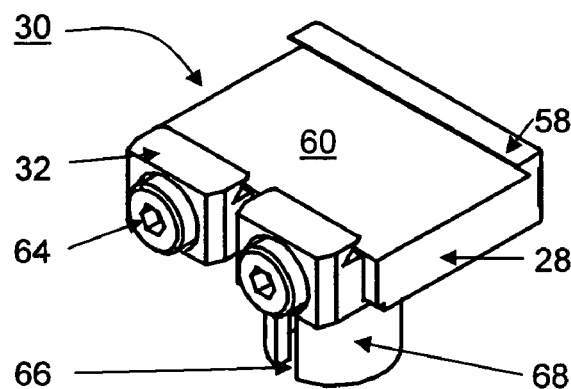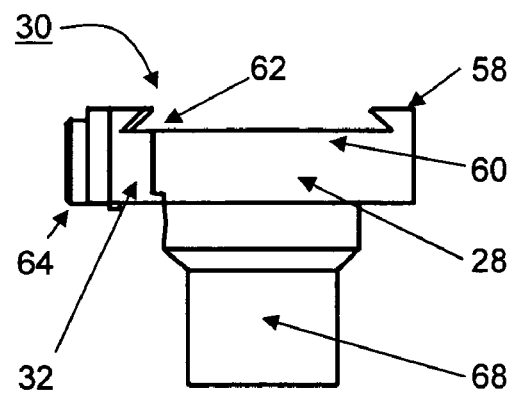
FIG. 8A  FIG. 8B

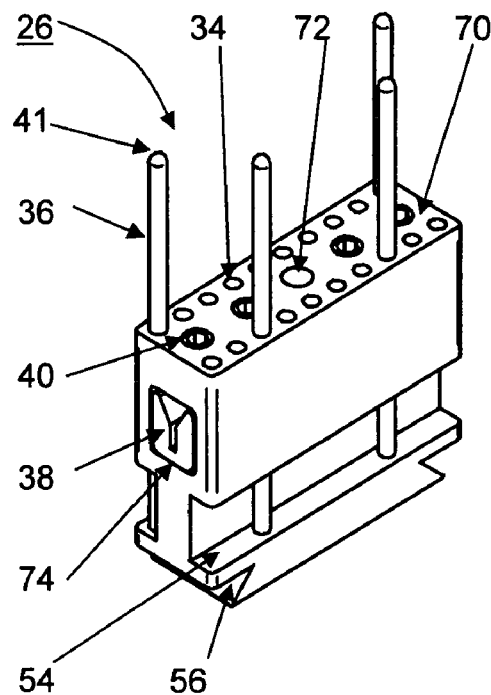
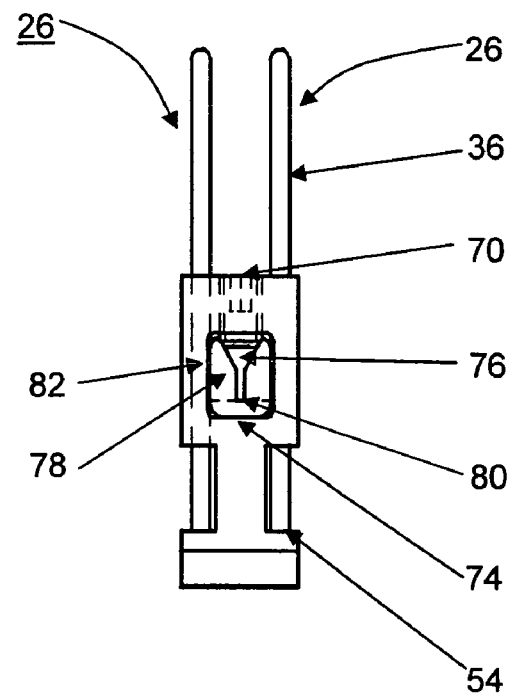
FIG. 9A  FIG. 9B
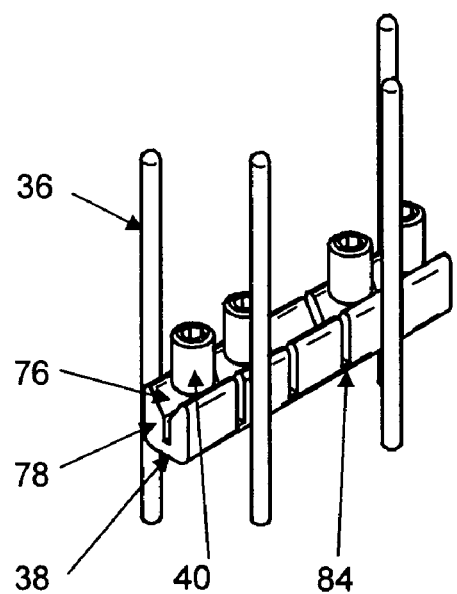
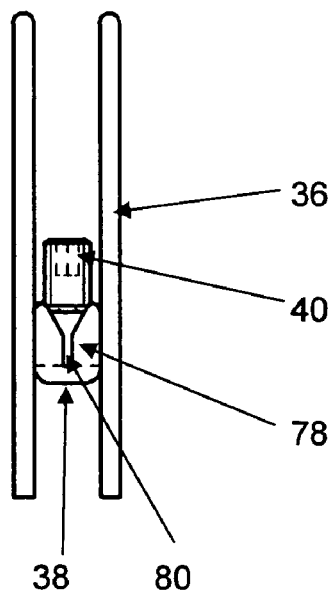
FIG. 10A  FIG. 10B

CONFIGURABLE DIE DETACHMENT APPARATUS

FIELD OF THE INVENTION

The invention relates to the processing of semiconductor devices, and in particular to detaching a semiconductor die from an adhesive tape.

BACKGROUND AND PRIOR ART

Die bonding is one of the key manufacturing processes in electronic packaging in which a semiconductor die singulated from a wafer is detached and picked from an adhesive dicing tape and then bonded onto a substrate, such as a copper leadframe or a printed wiring board ("PWB") substrate.

During the die detachment part of the process, a die from a saw-singulated wafer is detached from an adhesive dicing tape using a technique that involves the utilization of a single or a plurality of push-up pin(s) for initiation and completion of the delamination of the die from the dicing tape with the cooperation of vacuum suction holding onto the dicing tape. This technique is commonly adopted for both die bonding and flip chip bonding processes.

Various pin assemblies have been implemented in the prior art to detach a die from an adhesive dicing tape. In a single push-up pin approach illustrated in U.S. Pat. No. 5,755,373 entitled "Die Push-Up Device", a single push-up pin approach is described in which a push-up pin, in the form of a needle, is fastened to a holder for pushing the die so as to separate the die from the dicing tape held by suction provided by a vacuum assembly. The vacuum assembly is usually held fixed and the push-up needle is independently movable by a raising-and-lowering motor driven mechanism.

When the push-up pin reaches its maximum height, the dicing tape is substantially delaminated from the die leaving only a small contact area supported by the pin. The adhesion of the die to the dicing tape is minimal, so that it is possible to lift the said die up from the dicing tape using a vacuum collet without damaging the die. However, as the size of the die increases in area and its thickness decreases, the single push-up pin approach will be inadequate for successful pick-up.

Alternatively, a two-stage ejection approach illustrated in U.S. Pat. No. 4,850,780 entitled "Pre-Peel Die Ejector Apparatus" attempts to overcome the above problem by providing a telescopic ejector chuck. The telescopic ejector chuck comprises an outer housing surrounded by vacuum suction apertures for pre-peeling the die, and a central housing with a motorized ejector pin connected to an ejector collar for pushing on the die away from the dicing tape so that the die is substantially detached from the dicing tape.

A disadvantage of this two-stage approach is the design complexity of the vacuum-and-spring-loaded telescopic ejector chuck, so that its size has to be relatively large. With its size constraint, the ejector chuck is found to be only effective for die sizes larger than 5 mm. The apparatus is therefore not applicable to semiconductor devices with smaller die sizes.

Another alternative approach is to use different ejector pin configurations to facilitate the die detachment process. This is illustrated in U.S. Pat. No. 6,201,306 entitled "Push-up Pin of a Semiconductor Element Pushing-Up Device, and a Method for Separating". This approach provides different push-up pins with tip end portions having different profiles that prevent the die from being damaged during die detachment from the dicing tape.

The use of push-up pins with different profiles may have reduced the risk of die damage, but frequent changing of push-up pins with different profiles for new devices may be necessary. Furthermore, if dice of different sizes are to be detached, this prior art does not teach the use of the same tool for these different dice. In addition, it does not cater for re-locating and optimizing the arrangement of the push-up pins for any given die.

A conventional approach to detaching a die from a dicing tape will be described in detail below. FIG. 1A is an isometric view of a push-up pins assembly 100 of the prior art. The push-up pins assembly 100 comprises a plurality of cylindrical push-up pins 102 attached to a plurality of pin mounting holes on a mounting chuck 104. Each push-up pin 102 comprises a tip 105 at one end for contacting the dicing tape during die detachment. The tip 105 is preferably round or tapered so as it will not damage the die when the pin 102 pushes against the dicing tape. A locking ring 106 is disposed on the mounting chuck 104 for locking the push-up pins 102 in position.

FIG. 1B is an isometric view of a die detachment apparatus 110 of the prior art incorporating the push-up pins assembly 100. The die detachment apparatus 110 comprises the push-up pins assembly 100 enclosed by a vacuum enclosure 112.

The vacuum enclosure 112 comprises a flat disc-like top platform 114 having a plurality of openings 116 arranged for the push-up pins 102 to project through and move up and down freely. There are the same number of openings 116 as there are push-up pins 102, and their respective configurations are fixed. When the push-up pins assembly 100 moves up, the push-up pins 102 will correspondingly rise and project their tips 105 above the top platform 114.

The top platform 114 further comprises a plurality of vacuum holes 118 arranged adjacent to the openings 116 for holding the dicing tape with vacuum suction provided by the vacuum enclosure 112 during die detachment. A vacuum seal ring 120 is disposed around the periphery of the top platform 114. The seal ring 120 helps to prevent vacuum leak from an interface between the dicing tape and the top platform 114, thus reinforcing the vacuum suction on the top platform 114.

FIGS. 2A to 2D are cross-sectional views of the die detachment apparatus 110 at various stages of a conventional die detachment process. Referring to FIG. 2A, at the initial stage, a singulated targeted die 122 adhesively attached to a dicing tape 124 is positioned centrally on the top platform 114. Vacuum suction is provided through the vacuum holes 118 thereby holding the dicing tape 124 against a flat top surface 126 of the top platform 114.

At this stage, the push-up pins 102 are located beneath the openings 116 just underneath the top surface 126 of the top platform 114. Meanwhile, a pick-up collet 128 comprising a centrally located vacuum hole 130 in communication with a die pick-up surface 132 is positioned over the targeted die 122.

Referring to FIG. 2B, the pick-up collet 128 has descended and its die pick-up surface 132 lands centrally on the top surface of the die 122. Vacuum suction is provided through the vacuum hole 130 thereby holding the die 122 against the die pick-up surface 132. The die 122 is held securely by the pick-up collet 128 for the rest of the die detachment process.

FIG. 2C is a cross-sectional view of the die detachment apparatus 110 at the third stage of the die detachment process. At this stage, a mechanical upward force is exerted on the back of the die 122 by the push-up pins 102, thereby raising it above the top surface 126 and pushing it away from the dicing tape 124. Simultaneously, the pick-up collet 128 holding the die 122 is elevated by the same distance as the push-up pins 102. Therefore the compressive force acting on the die 122 by both the pick-up collet 128 and the push-up pins 102 is minimized.

The dicing tape 124 is held down against the top surface 126 of the top platform 114 by vacuum suction provided through the vacuum holes 118. Hence, a bending moment induced on the die 122 creates a peeling stress along the interface between the die 122 and the dicing tape 124, thus causing delamination along the interface. The delamination continues as the push-up pins 102 elevate until they reach a predetermined maximum height.

At the end of the push-up action lifting the die 122, the die 122 is held by the pick-up collet 128 and supported only by the tip 105 of the push-up pins 102. The die 122 is substantially separated from the dicing tape 124 with only minimal residual contact area at the tips 105. Hence the adhesion between the die 122 and the dicing tape 124 at these points is very weak.

Referring to FIG. 2D, at the final stage of the die detachment process, the pick-up collet 128 holding the die 122 will stay at the predetermined maximum height for a given delay time, a so-called "pick delay", before it continues to rise until the die 122 is completely detached from the dicing tape 124.

After the die 122 is completely detached from the dicing tape 124, the push-up pins 102 descend back to their original level underneath the top surface 126 of the top platform 114. The vacuum suction applied to the vacuum holes 118 on the top platform 114 of the vacuum enclosure 112 is then turned off and the dicing tape 124 is unstretched and lies flat on the top platform 114. The collet 128 holding the die 122 will transport the die 122 to a die bonding location before another die detachment process is repeated. In the meantime, another target die will be positioned at the centre of the top platform 114 of the vacuum enclosure 112 to get ready for the next process cycle.

In the die detachment apparatus 110 of the prior art illustrated in FIGS. 1A and 1B, the pattern of the openings 116 on the top platform 114 has to be arranged according to the locations of the push-up pins 102 on the mounting chuck 104. Thus, the openings 116 of the vacuum enclosure 112 and the push-up pins assembly 100 form matching pairs.

When the thickness of a die is more than 0.15 mm, the location of the push-up pins 102 is not as critical, and one arrangement of push-up pins 102 may be applicable for a wide range of die sizes. However, when the thickness of a die is very thin, such as less than 0.15 mm, the arrangement and locations of the push-up pins 102 are critical as incorrect positioning may cause die crack failure during the die detachment process.

The arrangement and locations of the push-up pins 102 underneath the die 122 are especially critical if the die has a thickness of less than 0.15 mm and has a die size of larger than 3 mm×3 mm. When the thickness of the die is reduced further to below 0.10 mm, the accuracy in the locations of the outermost push-up pins 102 from the edges of the die 122 would preferably be within +/−0.2 mm from their optimal locations.

A problem with the push-up pins arrangement of the prior art is that the push-up pins 102 are not allowed to be relocated freely. They are mounted at fixed and predetermined locations on the push-up pins assembly 100 without any option for selectively mounting the push-up pins 102 in other configurations. Thus, re-location of push-up pins 102 is not possible for dice of different sizes that need to be handled by the same apparatus.

The invention seeks to alleviate the aforesaid problem of the prior art by providing a die detachment apparatus wherein the locations of the push-up pins on a push-up pins assembly are not constrained as aforesaid, in order to cater to critical applications such as the detachment of very thin dice of different sizes by using the same apparatus.

SUMMARY OF THE INVENTION

It is thus an object of the invention to seek to provide a configurable die detachment apparatus comprising a vacuum enclosure and a push-up pins assembly that allows flexible re-configuration and re-locating of push-up pins for dice of various sizes.

Accordingly, the invention provides an apparatus for die detachment, comprising: at least one pin mounting assembly having a plurality of pin sites for selectively mounting ejector pins in a desired configuration on some of the pin sites, and a vacuum enclosure enclosing the pin mounting assembly and having a support platform comprising a plurality of openings that are sized and arranged to accommodate different configurations of ejector pins mounted on the pin mounting assembly, the ejector pins being drivable to project through the openings towards a die to be detached.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus for die detachment in accordance with the invention will now be described with reference to the accompanying drawings, in which:

FIGS. 7A and 7B are a front view and a side view of the push-up pin assembly of the die detachment apparatus respectively;

FIGS. 8A and 8B are an isometric view and a side view of the pin chuck holder of the die detachment apparatus respectively;

FIGS. 9A and 9B are an isometric view and front view of the pin chuck respectively mounted with a plurality of push-up pins;

FIGS. 10A and 10B are an isometric view and a front view of a pin lock respectively arranged with a plurality of push-up pins and a plurality of locking screws;

DETAILED DESCRIPTION OF THE PREFERRED EMBODIMENT

Figure 1A:
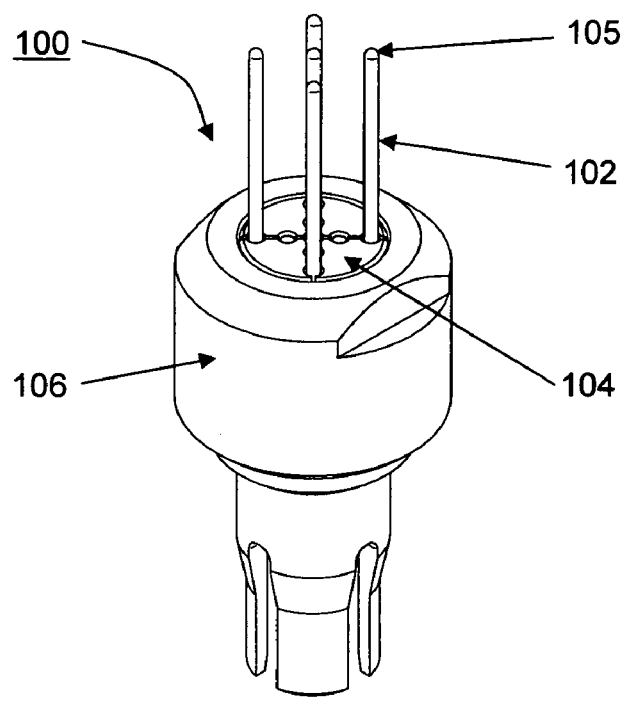
FIG. 1A is an isometric view of a push-up pins assembly of the prior art.
Figure 1B:
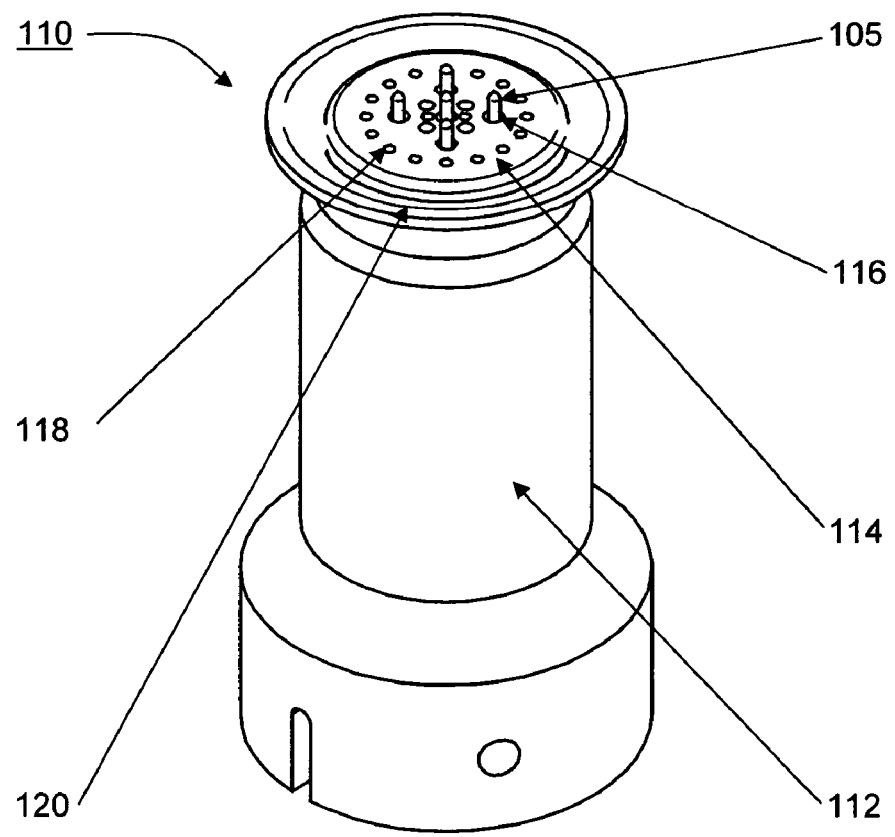
FIG. 1B is an isometric view of a die detachment apparatus of the prior art incorporating the push-up pins assembly.
Figure 2A:
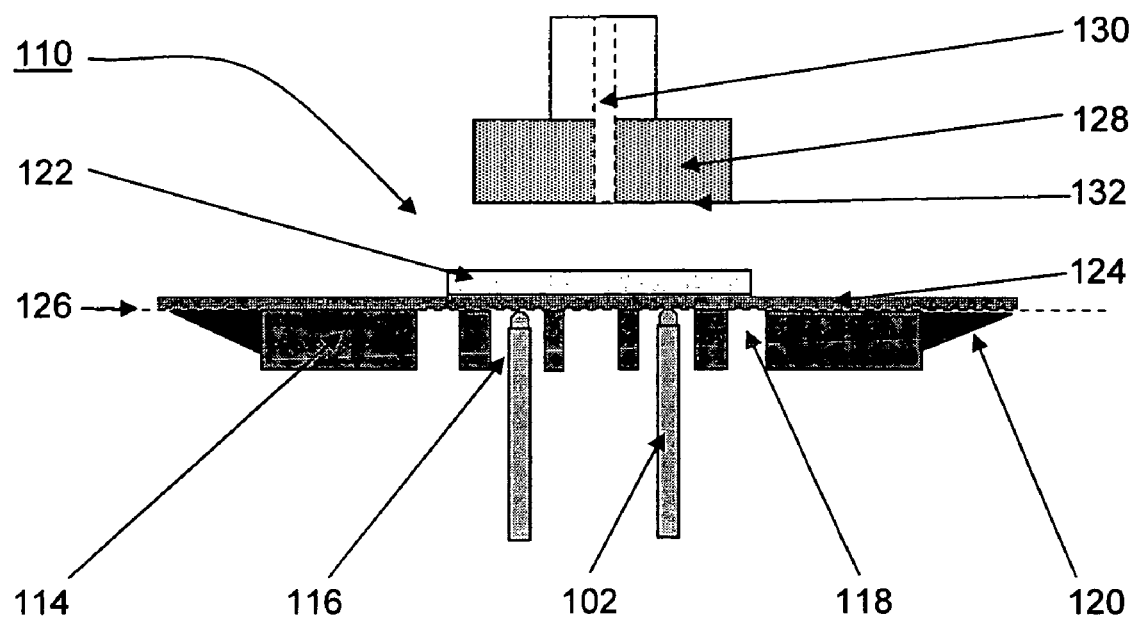
FIGS. 2A-2D are cross sectional views of a die detachment apparatus at various stages of a conventional die detachment process.
Figure 2B:
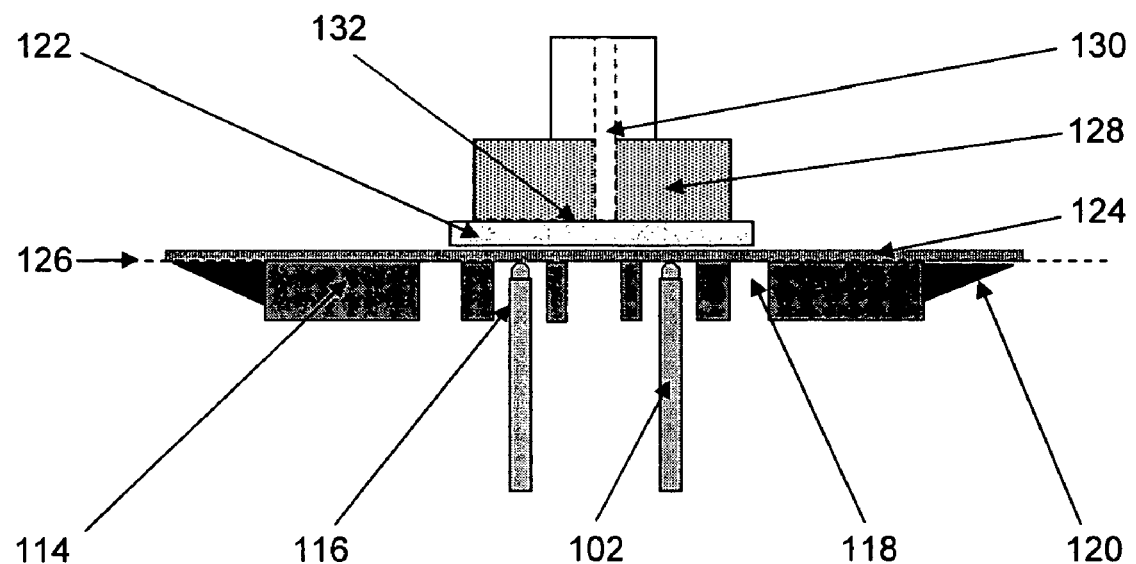
Figure 2C:
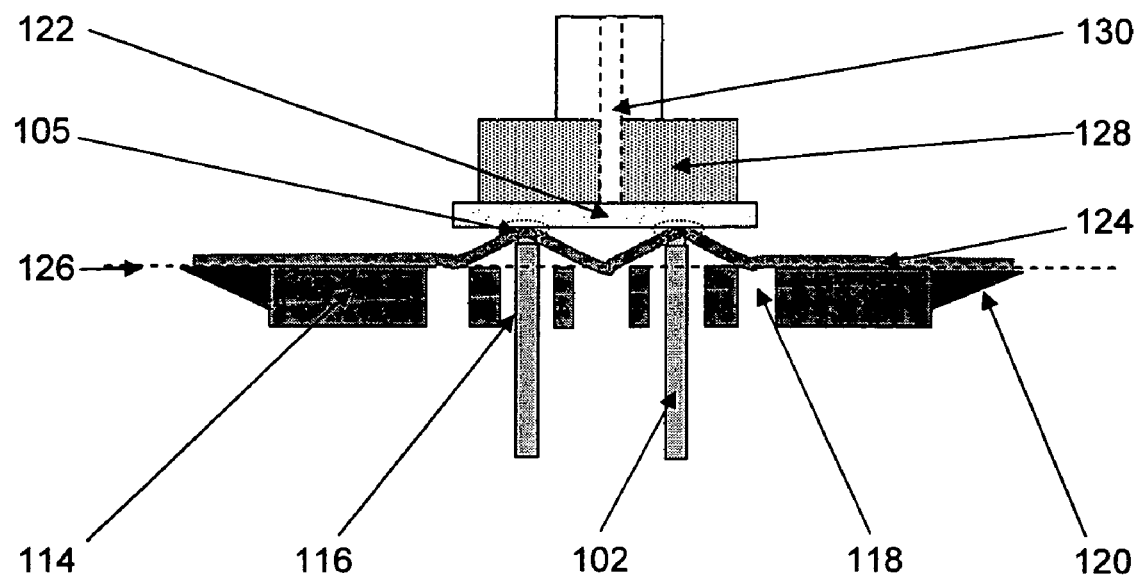
Figure 2D:
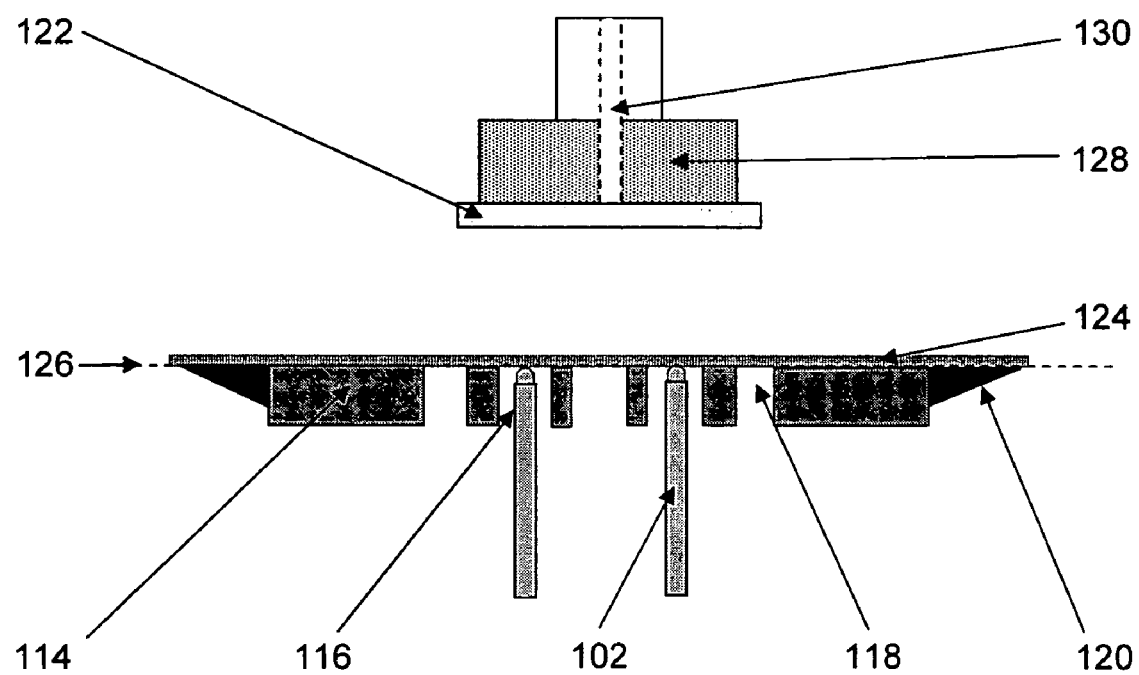
Figure 3A:
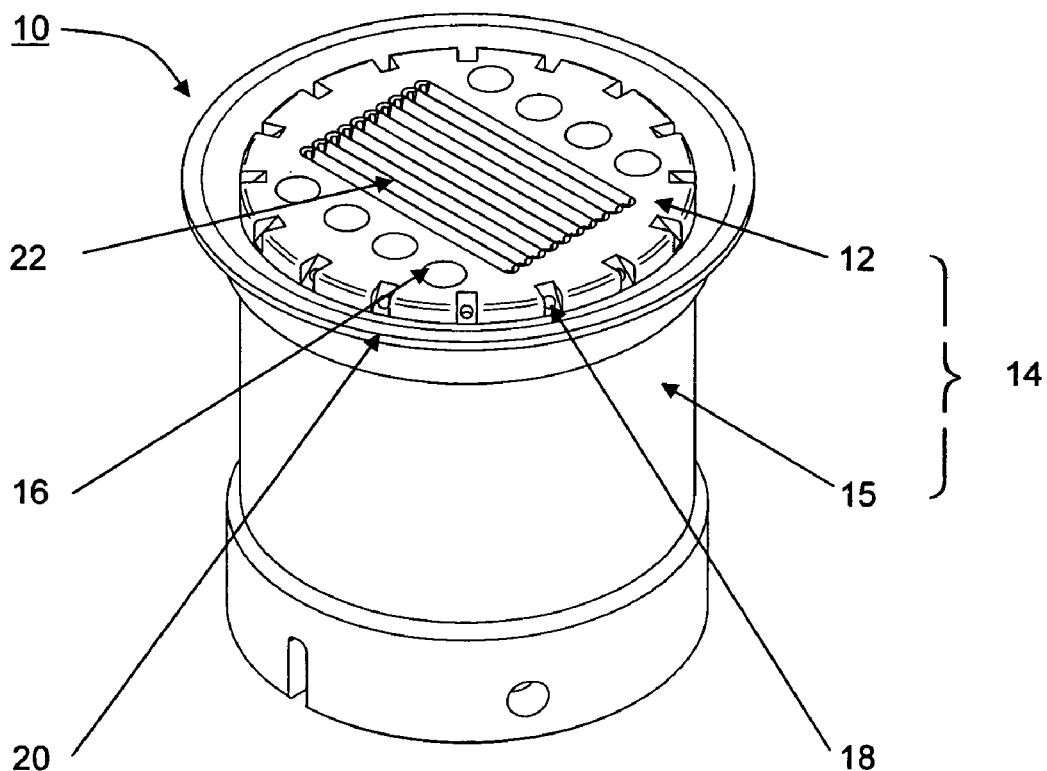
FIG. 3A is an isometric view of a vacuum enclosure of a die detachment apparatus according to the preferred embodiment of the invention.

Referring to the drawings in which like parts are referred to by like numerals, FIG. 3A is an isometric view of a vacuum enclosure 14 of a die detachment apparatus 10 according to the preferred embodiment of the invention. The vacuum enclosure 14 comprises a flat disc-like support platform in the form of a top platform 12 mounted on top of a cylindrical housing 15 for holding a dicing tape (not shown).

The top platform 12 comprises a plurality of vacuum holes 16 arranged on the top surface. When vacuum suction is provided by the vacuum enclosure 14, the dicing tape will be held down against the surface of the top platform 12 through the vacuum holes 16. A plurality of peripheral vacuum holes 18 and a rubber seal ring 20 are circumferentially disposed on the top platform 12 for building up vacuum pressure between the top platform 12 and the dicing tape.

The top platform 12 further comprises a plurality of openings, such as parallel slots 22 arranged centrally on the top platform 12. The slots 22 are preferably made in such a way that the slots have equal width and there is equal pitch between adjacent slots.

Figure 3B:
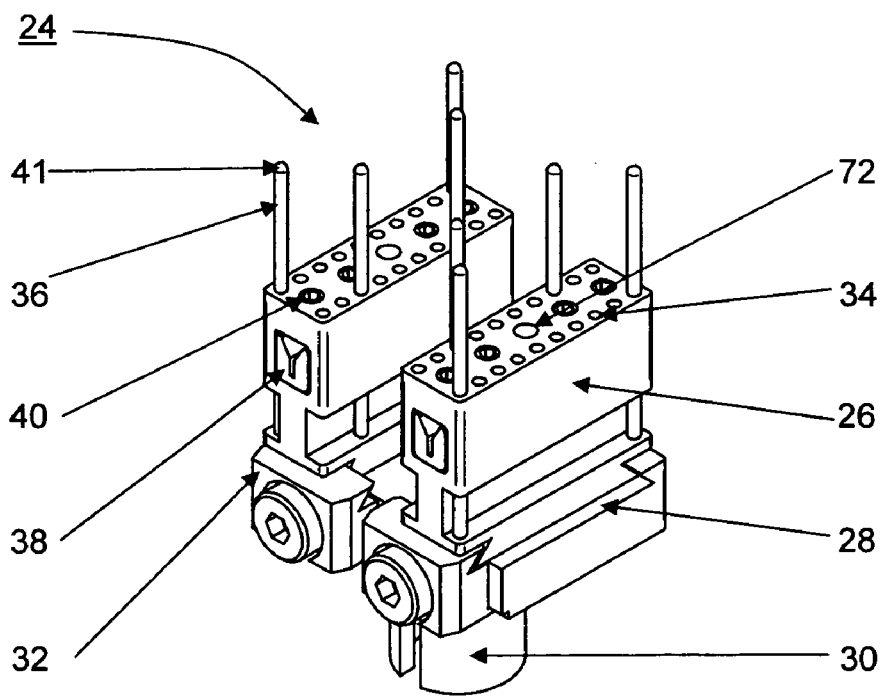
FIG. 3B is an isometric view of a push-up pins assembly of a die detachment apparatus according to the preferred embodiment of the invention.

FIG. 3B is an isometric view of a push-up pins assembly 24 of a die detachment apparatus 10 according to the preferred embodiment of the invention. The push-up pins assembly 24 comprises a plurality of ejector pins, such as push-up pins 36 inserted at predetermined locations for pushing against a die during die detachment. Each push-up pin 36 comprises a tip 41 at one end for contacting the dicing tape. The tip 41 is preferably round or tapered so as it will not damage the die when the pin 36 pushes against the dicing tape.

Figure 3C:
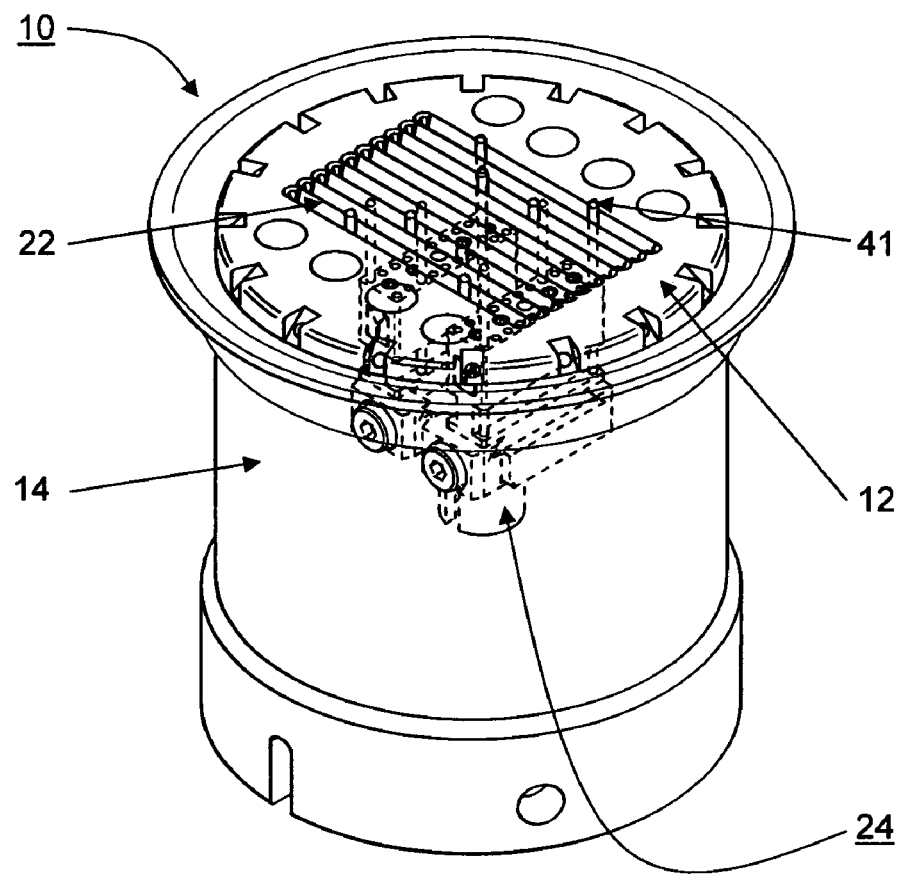
FIG. 3C is an isometric view of the die detachment apparatus with the vacuum enclosure of FIG. 3A incorporating the push-up pins assembly of FIG. 3B.

FIG. 3C is an isometric view of the die detachment apparatus 10 with the vacuum enclosure 14 of FIG. 3A incorporating the push-up pins assembly 24 of FIG. 3B. The push-up pins assembly 24 is enclosed in the vacuum enclosure 14 wherein the push-up pins 36 are arranged such that their tips 41 are able to move freely up and down and project through the openings of the slots 22 on the top platform 12 towards a die to be detached. The parallel slots 22 are sized and arranged to accommodate different configurations of push-up pins 36 and advantageously allow the push-up pins 36 to be freely located at any position along the slots 22 as demanded by different die sizes.

The center of the push-up pins assembly 24 is aligned with the centre of the vacuum enclosure 14 such that an adjustable axis of the push-up pin assembly 24 is aligned along a longitudinal axis of the parallel slots 22 that are arranged on the top platform 12.

Figure 4:
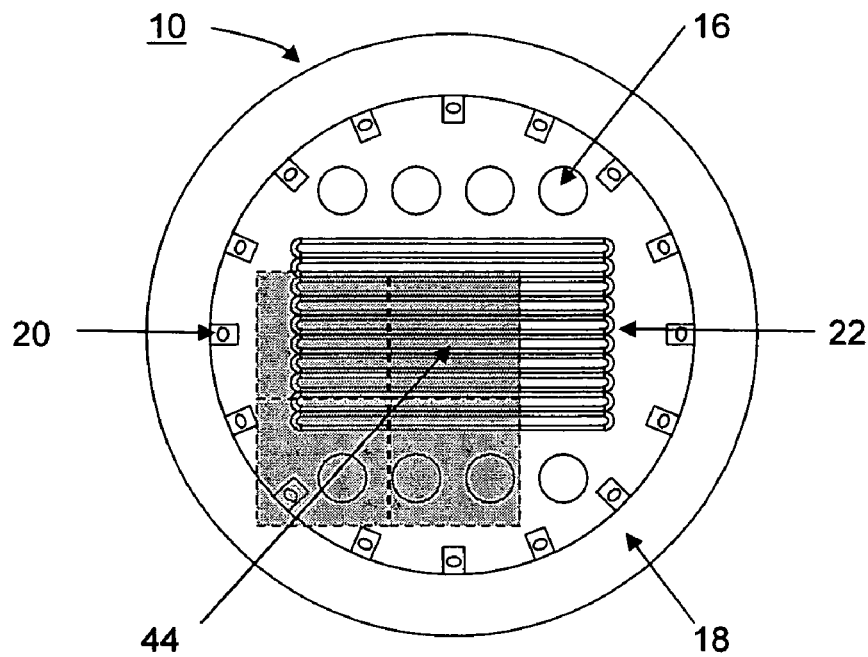
FIG. 4 is a top view of the die detachment apparatus located under a singulated die.

In operation, a singulated targeted die adhesively attached to a dicing tape is positioned centrally on the top platform 12. FIG. 4 is a top view of the die detachment apparatus 10 located under a singulated die 44. The die 44 is positioned centrally on the top platform 12 such that one of its axes is oriented parallel to the longitudinal axis of the parallel slots 22 on the top platform 12, where the push-up pins 36 of the push-up assembly 24 are arranged to project from.

Figure 5:
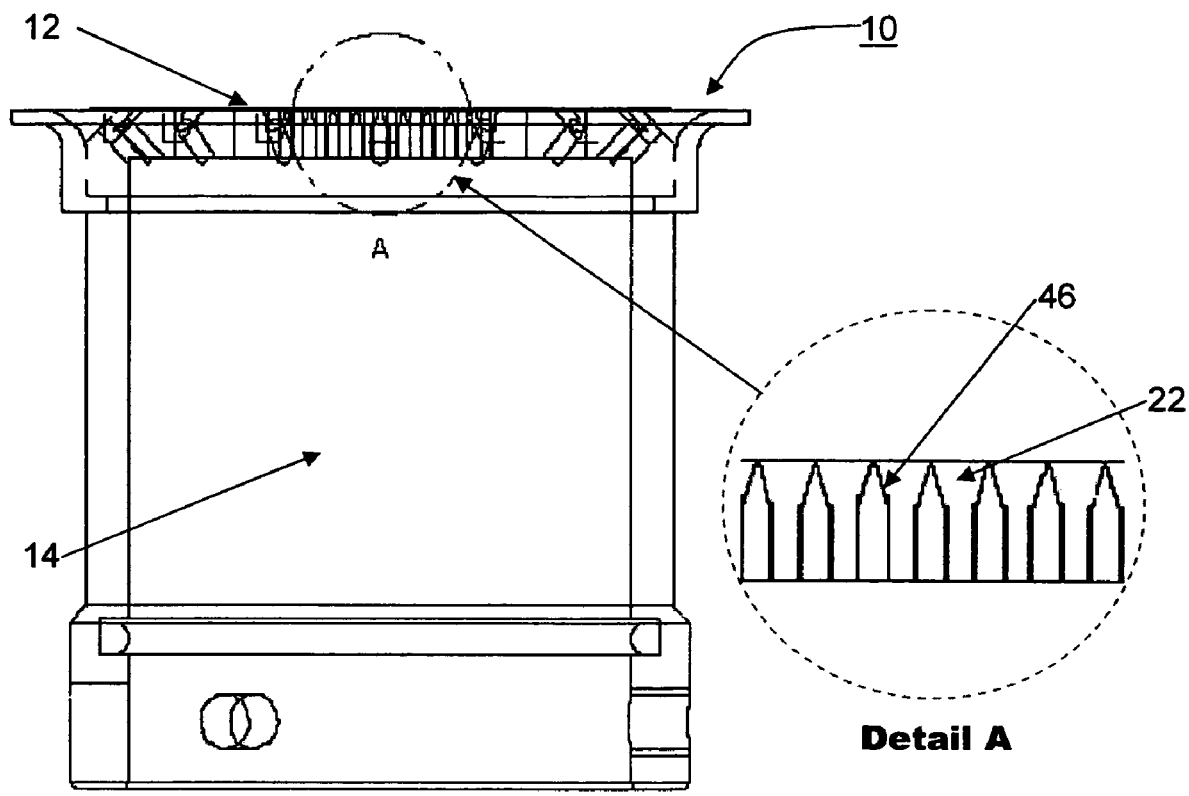
FIG. 5 is a cross-sectional view of the vacuum enclosure of the die detachment apparatus including detail A showing a sectional view of ridges of the vacuum slots on the top platform.

The parallel slots 22 comprise sharp ridges at the top for supporting the dicing tape. FIG. 5 is a cross-sectional view of the vacuum enclosure 14 of the die detachment apparatus 10 including detail A showing a sectional view of the sharp ridges 46 of the vacuum slots 22 on the top platform 12. The sharp ridges 46 are formed between adjacent parallel slots 22 facing the die to be detached.

Figure 6:
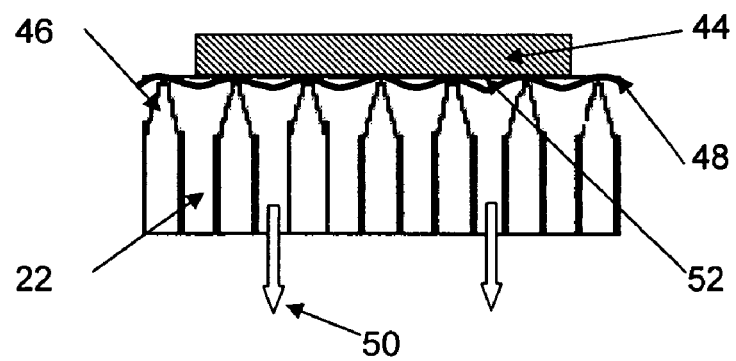
FIG. 6 is a cross-sectional view of a singulated die attached to a dicing tape which is held by vacuum suction against the top platform of the vacuum enclosure of the die detachment apparatus.

The parallel slots 22 are in fluid communication with the vacuum suction force generated in the vacuum enclosure 14. When vacuum suction is provided through the vacuum holes 16 and parallel slots 22, the dicing tape is held against the flat top platform 12 by suction pressure. FIG. 6 is a cross-sectional view of a singulated die 44 attached to a dicing tape 48 which is held by vacuum suction 50 against the top platform 12 of the vacuum enclosure 14 of the die detachment apparatus 10.

When vacuum suction 50 is provided by the vacuum enclosure 14 through the slots 22, the dicing tape 48 is pulled down by the vacuum suction 50 away from the die 44. Since the die 44 is supported by the sharp ridges 46, the strong vacuum suction 50 will create partial delamination 52 of the die 44 at the positions where the die 44 is not supported by the sharp ridges 46. Hence, the bottom surface of the die 44 is partially pre-peeled from the dicing tape 48.

Meanwhile, the push-up pins assembly 24 will move up by actuating a vertical up/down actuator (not shown). Accordingly, the tips 41 of the push-up pins 36 will project through the slots 22 and exert a mechanical force on the back of the die 44. This raises the die 44 above the top surface of the top platform 12 and pushes it away from the dicing tape 48. Since the dicing tape 48 is held against the top platform 12 by vacuum suction, delamination between the die 44 and the dicing tape 48 is initiated from the edges of the die 44 and propagates along the interface between the die 44 and the dicing tape 48 until complete detachment of the die 44 from the dicing tape 48.

FIGS. 7A and 7B are a front view and a side view of a push-up pin assembly 24 of the die detachment apparatus 10 respectively. The push-up pin assembly 24 in the form of a pin mounting assembly preferably comprises at least two pin chucks 26 mounted on a sliding table 28 of a pin chuck holder 30. The sliding table 28 is preferably configured to support the at least two pin chucks 26. When adjusting and aligning the push-up pins 36 to the parallel slots 22 on the top platform 12, one is able to fine-tune the positions of the pin chucks 26 along a sliding axis of the sliding table 28 on the pin chuck holder 30.

FIGS. 8A and 8B are an isometric view and a side view of the pin chuck holder 30 of the die detachment apparatus 10 respectively. The pin chuck holder 30 comprises a mounting base 68 for attaching the pin chuck holder 30 onto a vertical up/down actuator. It includes an orientation guiding slot 66 disposed parallel to a longitudinal axis of the cylindrical mounting base 68 for ensuring correct orientation of the pin chuck holder 30 when it is mounted onto the vertical up/down actuator.

The sliding table 28 has a flat top surface 60 for supporting the pair of pin chucks 26. The pin chucks 26 are mountable at different positions relative to each other on the sliding table 28. The sliding table 28 also includes a protruding guiding flange 58 disposed at its rear side. The protruding guiding flange 58 has an inner guiding surface to which the pin chucks 26 are guided and oriented along the sliding axis of the sliding table 28.

The pin chucks 26 are fastened onto the sliding table 28 of the pin chuck holder 30 by a pair of front side clamps 32 on the front edge of the sliding table 28. The triangle slots 62 of the front side clamps 32 as well as the rear side guiding flange 58 form a locking feature for securing the pin chucks 26 onto the pin chuck holder 30.

FIGS. 9A and 9B are an isometric view and front view of the pin chuck 26 respectively mounted with a plurality of push-up pins 36. The pin chuck 26 comprises a swallow-tailed guide 56 disposed adjacent to the base of the pin chuck 26. The swallow-tailed guide 56 is mounted between the guiding flange 58 and the front side clamp 32 of the pin chuck holder 30 so that the pin chuck 26 is adjustable along the sliding axis of guiding flange 58 and secured by the front side clamp 32 of the pin chuck holder 30.

When the screws 64 of the front side clamps 32 are tightened to produce a clamping force, one component of the clamping force will push the pin chucks 26 such that the rear side of the its swallow-tailed guide 56 presses against the inner surface of the guiding flange 58 of the pin chuck holder 30. Another clamping force component will press down on the front side of its swallow-tailed guide 56 for pushing the bottom surface of the pin chuck 26 against the top surface 60 of the sliding table 28. Thus the pair of pin chucks 26 are clamped securely by the pair of front side clamps 32 onto the pin chuck holder 30.

The pin chuck 26 further comprises a plurality of pin sites, which may be in the form of pin mounting holes 34 preferably arranged in two columns and each column being located along the edges of the pin chuck 26 on its top surface 70 to allow a plurality of push-up pins 36 to be selectively inserted and mounted in a desired configuration. The mounting holes 34 are preferably of the same pitch as the parallel slots 22 on the top platform 12 to allow the push-up pins 36 to be re-configurable and re-locatable according to the size of a die and still be accommodated by the parallel slots 22. As opposed to prior art devices that accommodate only a fixed configuration of pins, the parallel slots 22 are sized and arranged to accommodate different configurations of push-up pins 36 mounted on the pin chuck 26.

When the push-up pins 36 are inserted into some of the pin mounting holes 34 according to a predetermined configuration, they will rest on a pin stopping surface 54 above the swallow-tailed guide 56. The pin stopping surface 54 acts as a supporting surface for the plurality of push-up pins 36.

The push-up pins 36 are fixed and clamped by a pin lock 38 inserted inside the pin chuck 26. The pin chuck 26 further comprises a column of centrally positioned threaded holes 72 arranged between the two columns of pin mounting holes 34 for receiving a plurality of locking screws 40 to cooperate with the pin lock 38 in locking the push-up pins 36 in place.

The pin lock 38 is in the form of a column. It is inserted into a center rectangular opening 74 extending perpendicular to the axes of the columns of threaded holes 72 on the pin chuck 26. The rectangular opening 74 is formed to cut through the pin mounting holes 34 to create an overcut 82 on the pin mounting holes 34.

FIGS. 10A and 10B are an isometric view and a front view of a pin lock 38 respectively arranged with a plurality of push-up pins 36 and a plurality of locking screws 40. The pin lock 38 is shown with an arrangement of a plurality of push-up pins 36 as well as a plurality of locking screws 40 attached to it.

The pin lock 38 comprises a V chamfer 76 disposed along its longitudinal axis. The V chamfer 76 has a side clamp 78 on each side and a middle gap 80 adjacent to the sharp end of the V chamfer 76. The pin lock 38 is preferably made of a copper-based alloy or engineering plastic so that the side clamp 78 can be opened up to clamp the push-up pins 36 adjacent to it by enlarging the middle gap 80 without exceeding the elastic limit of the material.

The side clamps 78 include a plurality of vertical cut-outs 84 for receiving and securing the push-up pins 36. The vertical cut-outs 84, preferably with widths of approximately 0.5 mm, are cut from the top of the V chamfer 76 to the bottom of the middle gap 80. The vertical cut-outs 84 separate the pin locks 38 into a plurality of sections such that each section on the side clamps 78 is adapted to clamp the push-up pins 36 independently.

In this preferred embodiment of the invention, there are four push-up pins 36 in each section of the pin lock 38 wherein a pair of side clamps 78 and a locking screw 40 disposed in that section are used to clamp the push-up pins 36. When the locking screws 40 are screwed into the column of threaded holes 72 of the pin chuck 26, they will press down on the V chamfer 76 to squeeze the side clamp 78 and the middle gap 80 of the pin lock 38 at the respective locations of the locking screws 40. The flexible side clamps 78 will be deformed elastically and pushed outward to press against the push-up pins 36 against both sides of the pin mounting holes 34 at the cutout area 82. Hence, the push-up pins 36 will be clamped and locked at their locations by the side clamps 78 of the pin lock 38.

One advantage of the preferred embodiment of the invention is that the adjustable pin chucks 26 allow the positions of the push-up pins 36 to be adjusted to any position along the parallel slots 22 on the top platform 12. The parallel slots 22 allow re-positioning of the push-up pins 36 along the longitudinal axis of the parallel slots 22.

In addition, the multiple pin mounting holes 34 on the pin chuck 26 allow the push-up pins 36 to be selectively mounted in any required configuration, thereby allowing the re-configurable and a re-locatable push-up pin assembly 24 to cater for dice of different sizes. Moreover, the pin locking mechanism of the invention allow the use of push-up pins 36 made of non-metallic material, such as engineering plastic pins, without permanently damaging these pins.

The positioning and arrangement of the push-up pins 36 in the pin mounting holes 34 depend on the size and thickness of the die 44 to be detached. The distance between adjacent pin mounting holes 34 and hence the pitch between adjacent parallel slots 22 is preferably less than 2 mm for a target minimum die thickness of approximately 0.080 mm. This allows the user to position the outermost push-up pins 36 so that the cantilevers of the die edges from these pins 36 or ridges 46 of the slots 22 are kept to less than 1 mm before the elevation of the push-up pins 36. The locations of the outermost push-up pins 36 on another side of the pin chuck 26 may be aligned by using a pin positioning setup gauge.

Figure 11A:
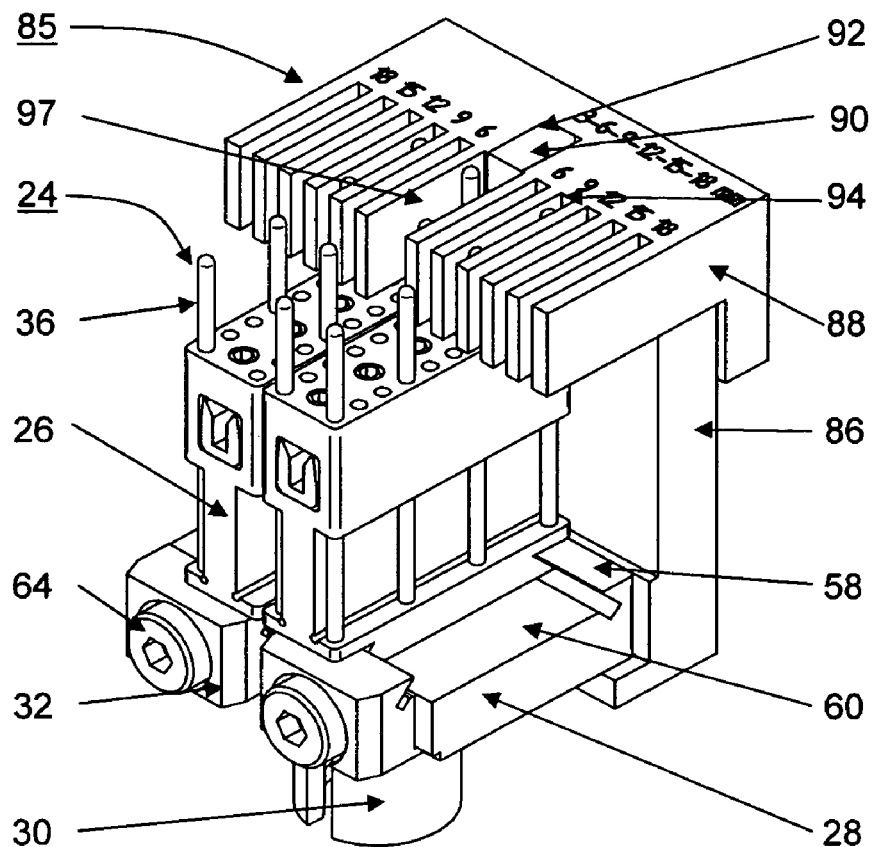
FIGS. 11A and 11B are an isometric view and an elevation view of a pin positioning setup gauge mounted to the push-up pins assembly respectively.
Figure 11B:
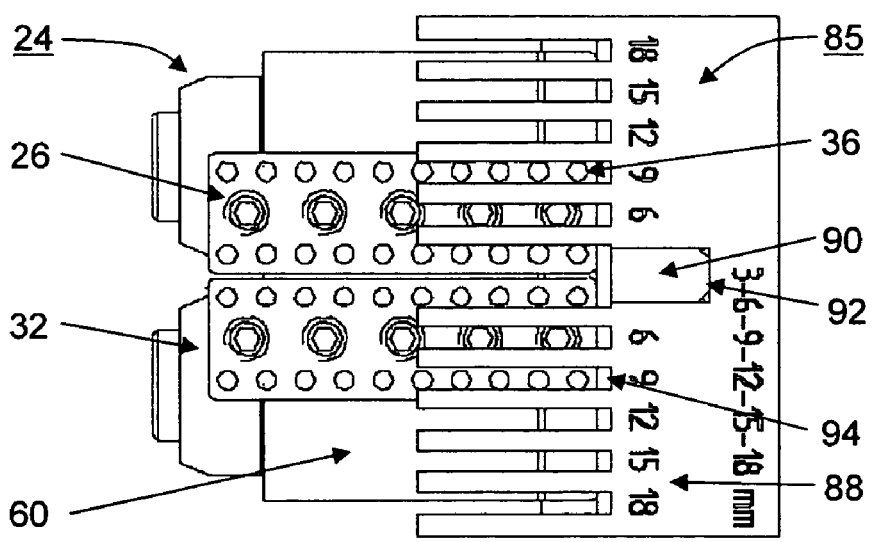

FIGS. 11A and 11B are an isometric view and an elevation view of a pin positioning setup gauge 85 mounted to the push-up pins assembly 24 respectively. The pin positioning setup gauge 85 comprises a replaceable pin positioning device 88 attached on top of a mounting base 86 for setting up the position of the push-up pins 36. The mounting base 86 is attached to the pin chuck holder 30 for pin positioning setup.

Figure 12A:
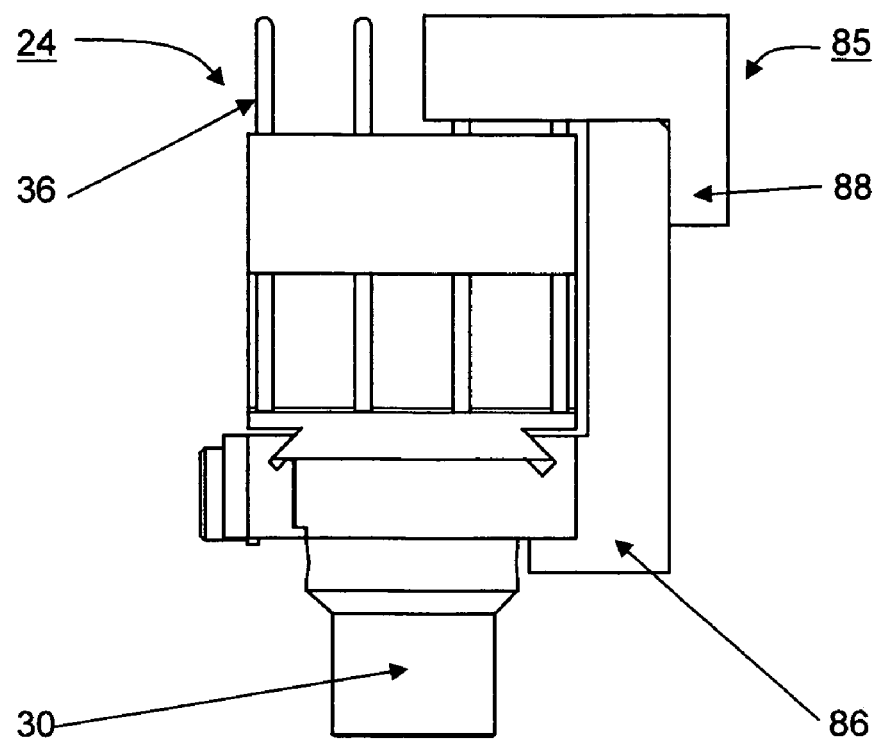
FIGS. 12A and 12B are a side view and a back view of a pin positioning setup gauge respectively attached to the pin chuck assembly.
Figure 12B:
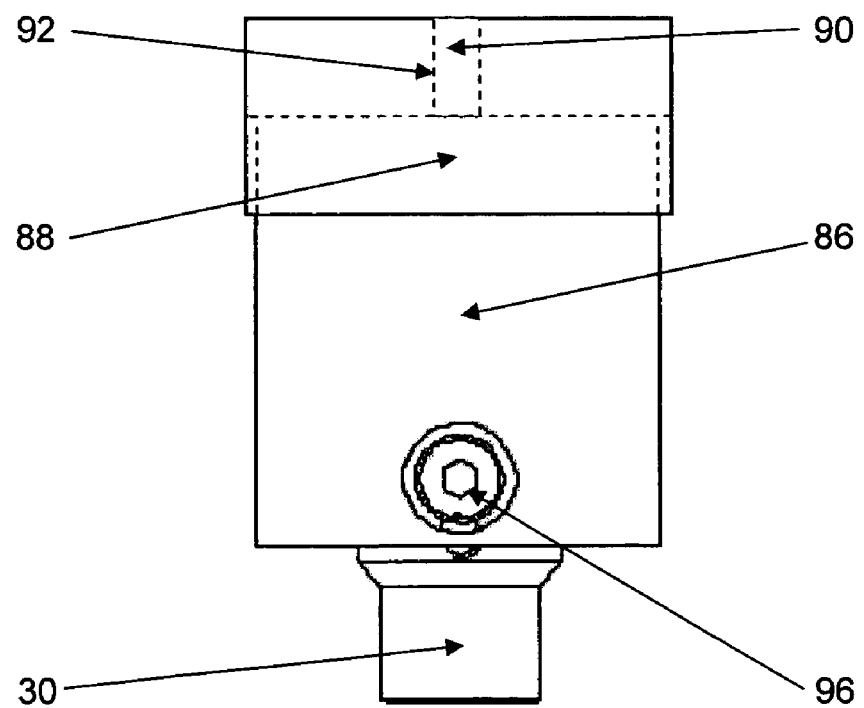

FIGS. 12A and 12B are a side view and a back view of a pin positioning setup gauge 85 respectively attached to the pin chuck assembly 24. The mounting base 86 of the pin positioning setup gauge 85 is mounted to the pin chuck holder 30 by a screw 96 at the back of the pin chuck holder 30. The mounting base 86 can easily be removed by unlocking the screw 96 after the pin positioning setup. The positioning device 88 is detachably positionable over the pin chuck 26 and adapted to indicate preferred positions of pin mounting holes 34 to be used for different push-up pin configurations according to predetermined die sizes.

Figure 13A:
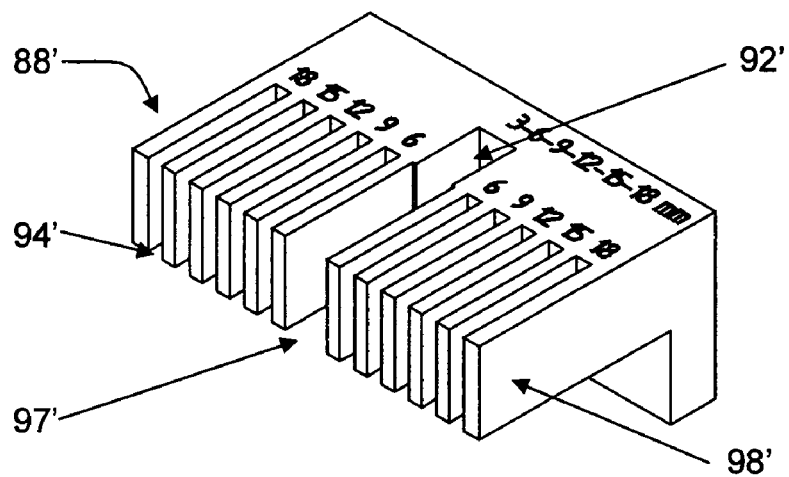
FIGS. 13A, 13B and 13C are isometric views of three different pin positioning devices for different selections of die sizes.
Figure 13B:
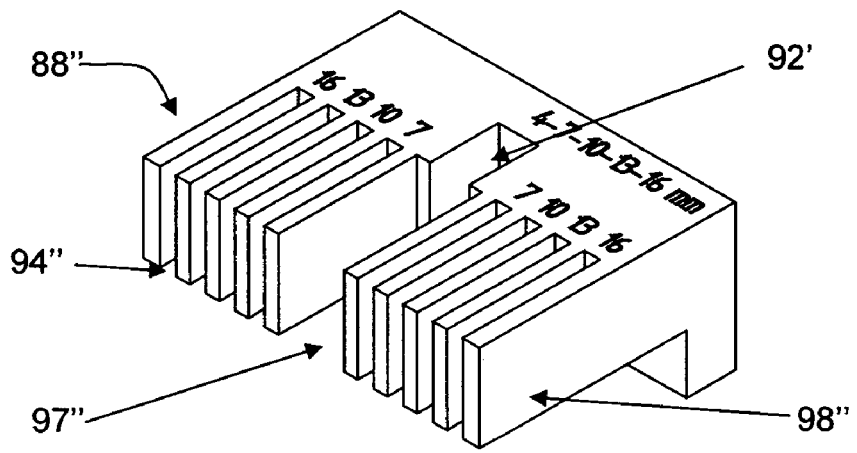
Figure 13C:
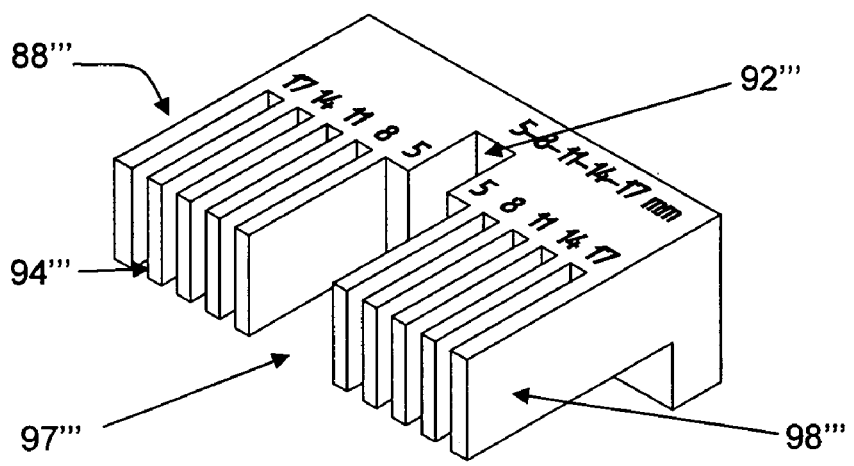

FIGS. 13A, 13B and 13C are isometric views of three different pin positioning devices 88 for different selections of die sizes. The pin positioning device 88 is selected based upon the size and thickness of a target die. Each pin positioning device 88 is made for a selection of pre-defined die sizes.

The pin positioning device 88 comprises a center guiding slot 92 for attachment to a center guiding block 90 on the mounting base 86. The pin positioning device 88 is lapped onto the mounting base 86 by inserting the center slot 92 of the pin positioning device 88 onto the center guiding block 90 of the mounting base 86.

The pin positioning device 88 further comprises pairs of flanges 98 centrally disposed on the pin positioning device 88. The center pair of flanges 98 is used to position the smallest die size for a given pin positioning device 88. FIGS. 13A, 13B and 13C each shows a pin positioning device 88 for positioning a plurality of push-up pins to handle dice of a series of predetermined sizes of (i) 3, 6, 9, 12, 15,18 mm, (ii) 4, 7, 10, 13,16 mm, and (iii) 5, 8, 11, 14,17 mm respectively. The dimensions reflect the widths of the type of die that a pin positioning device 88 is fabricated for handling. Therefore, the gap 97 between the flanges 98 at the center of the device 88 is the biggest for the 5-8-11-14-17 mm device 88''' and smallest for the 3-6-9-12-15-18 mm device 88'.

The pin positioning device 88 includes a plurality of slots 94 with a predetermined slot size for guiding the push-up pins 36 which are to be mounted onto the adjustable pin chuck 26 during their position setup. The guiding slots 94 are bounded by the columns of flanges extending parallel to the orientation of push-up pins 36 mounted on the pin mounting holes 34. The adjustable pin chuck 26 is aligned such that the outermost push-up pins 36 are guidably inserted into the appropriate guiding slots 94 of the pin positioning device 88 wherein predetermined pin positions are defined for a given die size.

In this configuration, the positions of the push-up pins 36 can be aligned to any location along one axis of a die. Hence, some dice with very large aspect ratios can also be handled by this apparatus.

If a die with a width of less than 4 mm is handled, only the pin mounting holes 34 of the inner column of the pin chuck 26 are used for inserting the push-up pins 36. If a die with a width of larger than 14 mm is handled, then an additional pin chuck 26 is needed to be placed at the middle of the die to provide additional support at the center region of the die.

If die sizes do not match perfectly to specific sizes that are on the pin positioning device 88, the user can use the following general rules (for non-critical applications or if the die thickness is larger than 0.1 mm): if a given die size is less than 0.5 mm larger than a specific die size on the pin positioning device 88, the slots for this specific die size on the pin positioning device 88 can be used for the given die. Similarly, if a given die size is less than 0.5 mm smaller than a specific die size on the pin positioning device 88, the slots for this specific die size on the pin positioning device 88 can be used for the given die. Thus, the guiding slot 94 on the pin positioning device 88 can handle dice with sizes of the specifically fabricated die size+/−0.5 mm.

The preferred embodiment of the invention is advantageous over the prior art by incorporating a push-up pin assembly 24 wherein the push-up pins 36 are re-configurable and re-locatable. The positions of the push-up pins 36 can be changed easily by inserting them into different mounting holes 34 on the pin chuck 26.

In addition, the pin chuck 26 also allows the positions of the push-up pins 36 to be adjustable to any location along one axis of the die that is aligned with the plurality of parallel slots 22 on the top platform 12 of the vacuum enclosure 14. With multiple pin mounting locations for inserting the push-up pins 36, and locations of push-up pins 36 that can easily be determinable with the help of the pin positioning device 88, the arrangement of the push-up pins 36 can be configured and adjusted to any position according to the demands of a given die size and thickness. Fine alignment of the push-up pins is also possible for very critical applications such as for detaching a die with a thickness of less than 0.1 mm from a dicing tape.

With a pin chuck holder configured for holding two or more pin chucks, the preferred embodiment of the invention can handle a very large number of die sizes, in the range of 3×3 to 14×14 mm. The preferred embodiment of the invention can also handle dice of high aspect ratios such as 3×14 mm. The die sizes may range from 3 mm×3 mm to 14 mm×14 mm and the die thickness may range from 0.070 mm to over 0.5 mm. In particular, when holding three pin chucks, it can handle die sizes of up to 14×18 mm.

Moreover, with the unique pin locking mechanism in the push-up pin assembly, metallic as well as non-metallic push-up pins can be used for pushing up the die. Thus, push-up pins of different materials may be used to cater for different critical die applications.

Furthermore, for some critical applications such as detaching a die of thickness as small as 0.08 mm from a dicing tape, a special pin positioning setup gauge can be used for setting up the position of the push-up pins. This allows more precise positioning of the push-up pins with respect to a die of any given size to minimize the cantilevers of the die edges from the pins or ridges of the slots on the top platform supporting the die to be kept to less than 1 mm.

The invention described herein is susceptible to variations, modifications and/or addition other than those specifically described and it is to be understood that the invention includes all such variations, modifications and/or additions which fall within the spirit and scope of the above description.

The invention claimed is:

1. Apparatus for die detachment, comprising:
  a pin mounting assembly having a plurality of pin sites for selectively mounting ejector pins in a first desired configuration on some of the pin sites, the ejector pins being operable to be relocated on the pin mounting assembly to form a second desired configuration; and
  a vacuum enclosure enclosing the pin mounting assembly, the vacuum enclosure having a support platform comprising a plurality of openings that are sized and arranged to accommodate different configurations of ejector pins mounted on the pin mounting assembly, the ejector pins being drivable to project through the openings towards a die to be detached.

2. Apparatus according to claim 1, wherein the pin mounting assembly comprises at least two pin chucks.

3. Apparatus according to claim 2, including a pin chuck holder that is configured for mounting the pin chucks such that the pin chucks are mountable at different positions relative to each other on the pin chuck holder.

4. Apparatus according to claim 3, wherein the pin chuck holder comprises a sliding table and guides for guiding relative sliding movement between the pin chucks.

5. Apparatus according to claim 3, including a clamp comprising triangular slots that are operable to clamp onto swallow-tailed guides located on the pin chucks for securing the pin chucks on the pin chuck holder.

6. Apparatus according to claim 2, wherein the pin sites are arranged in the form of two columns of pin mounting holes on each pin chuck.

7. Apparatus according to claim 2, further comprising a pin lock that is insertable into each pin chuck, the pin lock being is operable to lock the ejector pins in position on the pin chuck.

8. Apparatus according to claim 7, wherein each pin lock is a column made of a copper-based alloy or engineering plastic.

9. Apparatus according to claim 1, wherein the openings on the support platform comprise multiple elongated slots that are arranged parallel to one another along an axis such that a die to be detached is arranged with one of its axes oriented parallel to the axis of the slots.

10. Apparatus according to claim 9, further comprising sharp ridges formed between adjacent parallel slots facing the die to be detached.

11. Apparatus according to claim 9, wherein the openings are in fluid communication with a vacuum suction force generated in the vacuum enclosure.

12. Apparatus according to claim 9, wherein the elongated slots have equal width and there is an equal pitch between adjacent elongated slots.

13. Apparatus according to claim 9, wherein a pitch between adjacent pin sites is equal to a pitch between adjacent elongated slots.

14. Apparatus according to claim 9, wherein a pitch between adjacent slots is less than 2 mm for detaching a minimum die thickness of 0.080 mm or less.

15. Apparatus according to claim 1, further comprising a positioning device that is detachably positionable over the pin mounting assembly and operable to indicate preferred positions of pin sites to be used for different ejector pin configurations according to predetermined die sizes.

16. Apparatus according to claim 15, wherein the positioning device includes guiding slots operable to guide positioning of the ejector pins for a series of die sizes.

17. Apparatus according to claim 16, wherein the guiding slots comprise columns of flanges extending parallel to an orientation of the ejector pins mounted on the pin sites.

18. Apparatus according to claim 1, wherein the apparatus is configured to accommodate the dice ranging from 3 mm to 18 mm in size.

* * * * *